United States Patent
Baumgartner et al.

(10) Patent No.: US 7,266,795 B2
(45) Date of Patent: Sep. 4, 2007

(54) SYSTEM AND METHOD FOR ENGINE-CONTROLLED CASE SPLITTING WITHIN MULTIPLE-ENGINE BASED VERIFICATION FRAMEWORK

(75) Inventors: Jason Raymond Baumgartner, Austin, TX (US); Robert Lowell Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 11/082,699

(22) Filed: Mar. 17, 2005

(65) Prior Publication Data

US 2006/0230370 A1    Oct. 12, 2006

(51) Int. Cl.
*G06F 17/50* (2006.01)
(52) U.S. Cl. ................. 716/5; 716/4; 716/17
(58) Field of Classification Search .......... 716/1, 716/4, 5, 7, 17
See application file for complete search history.

(56) References Cited

U.S. PATENT DOCUMENTS 5,528,508 A * 6/1996 Russell et al. ............. 716/8

6,698,003 B2    2/2004 Baumgartner et al.

OTHER PUBLICATIONS

Baumgartner et al., "Scalable Automated Verification via Expert-System Guided Transformations", Article, 2004, vol./Issue Unknown Springer-Verlag Berlin Heidelberg.
Mony et al., "Method and System for Engine-Controlled Case Splitting within a Multiple-Engine Based Verification Framework", IBM Confidential Document, Aug. 2004.

* cited by examiner

*Primary Examiner*—Thuan Do
(74) *Attorney, Agent, or Firm*—Casimer K. Salys; Dillon & Yudell LLP

(57) ABSTRACT

A system and method for implementing a verification system. Included is a first set of verification engines for attempting to solve a verification problem. At least one of the first set of verification engines divides the verification problem into a set of partitions and passes at least one of the set of partitions to a second set of verification engines. Each one of the set of partitions may be passed to a distinctly separate verification engine. A system framework is configured to communicate with an application program and further configured to instantiate at least one verification engine in a user-defined sequence. Included within at least one of the first set of verification engines is a means for communicating verification information to the second set of verification engines.

19 Claims, 5 Drawing Sheets

SYSTEM AND METHOD FOR ENGINE-CONTROLLED CASE SPLITTING WITHIN MULTIPLE-ENGINE BASED VERIFICATION FRAMEWORK

BACKGROUND OF THE INVENTION

1. Technical Field

The present invention generally relates to the field of integrated circuit design verification and more particularly to a system and method for managing integrated circuit design verification utilizing modular design verification engines and a verification framework that employ a common interface to facilitate the exchange of verification information and design flows.

2. Description of the Related Art

As the complexity of microprocessors and other sophisticated integrated circuits has increased over the years, the resources devoted to integrated circuit design verification has accounted for an increasingly large percentage of the total resources required to develop and manufacture an integrated circuit. Indeed, the verification of advanced integrated circuits, such as microprocessors with multiprocessing capability, is now estimated to consume more time, labor, and other resources than the actual design of the device.

Traditionally, functional verification has been accomplished by generating a large number of test programs or test cases and running these test programs on a simulator that attempts to model the operation of the device. Designers and verification engineers frequently develop these test cases manually with the help of various random and specific test generators. As the number of transistors, functions, registers, and other facilities in the integrated circuit have increased, conventional verification methods have responded by simply increasing the number of tests that are simulated. Unfortunately, generating a seemingly infinite number of tests is an inefficient and unreliable method of verifying the functionality of all components in the integrated circuit.

In the early days of microprocessor development, inefficiencies in functional verification were tolerated because the size of the test space (measured, for example, by the number of states the microprocessor may assume) was sufficiently small. In addition, early microprocessors typically had fewer functional units than modern microprocessors, and the interactions between the components and functions were well understood and controlled. The increasing number of functional units in microprocessors is significant from a verification perspective because interaction between functional units can no longer be ignored or only loosely verified by conventional verification methodologies.

Because of the many possible applications and uses of modern integrated circuits, integrated circuit designers cannot predict and test every possible real-world configuration in which the integrated circuit may be employed. The test space of a microprocessor is approximately equal to $2^n$ where n represents the number of latches (state storage devices) within the microprocessor. From this approximation, it will be appreciated that the test space of microprocessors increases exponentially as the number of latches is increased.

The conventional approach to functional verification, in which increased complexity in a device is verified by simply increasing the number of tests that are simulated, is rapidly becoming infeasible. In addition, because the input to a simulator in a conventional verification process is simply a large number of deterministic tests or randomly generated tests, the output of the simulation must be painstakingly evaluated to determine whether a particular simulation was successful in testing the intended functionality of the device.

It would be desirable to implement a test verification system that addresses the problems associated with design verification of complex integrated circuits, like microprocessors. It would be further desirable if the implemented system employed a set of modular and relatively compact verification engines that could be invoked in a determinable sequence. It would be further desirable if the system included a verification framework capable of communicating with a user application program to enable the user to create customized sequences comprised of the modular engines and to apply the customized sequence to a defined verification problem.

SUMMARY OF THE INVENTION

A system and method are disclosed for implementing a verification system, including a first set of verification engines for attempting to solve a verification problem. At least one of the first set of verification engines divides the verification problem into a set of partitions and passes at least one of the set of partitions to a second set of verification engines. Each one of the set of partitions may be passed to a distinctly separate verification engine. A system framework is configured to communicate with an application program and further configured to instantiate at least one verification engine in a user-defined sequence. Included within at least one of the first set of verification engines is a means for communicating verification information to the second set of verification engines.

BRIEF DESCRIPTION OF THE FIGURES

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF A PREFERRED EMBODIMENT

Figure 1:
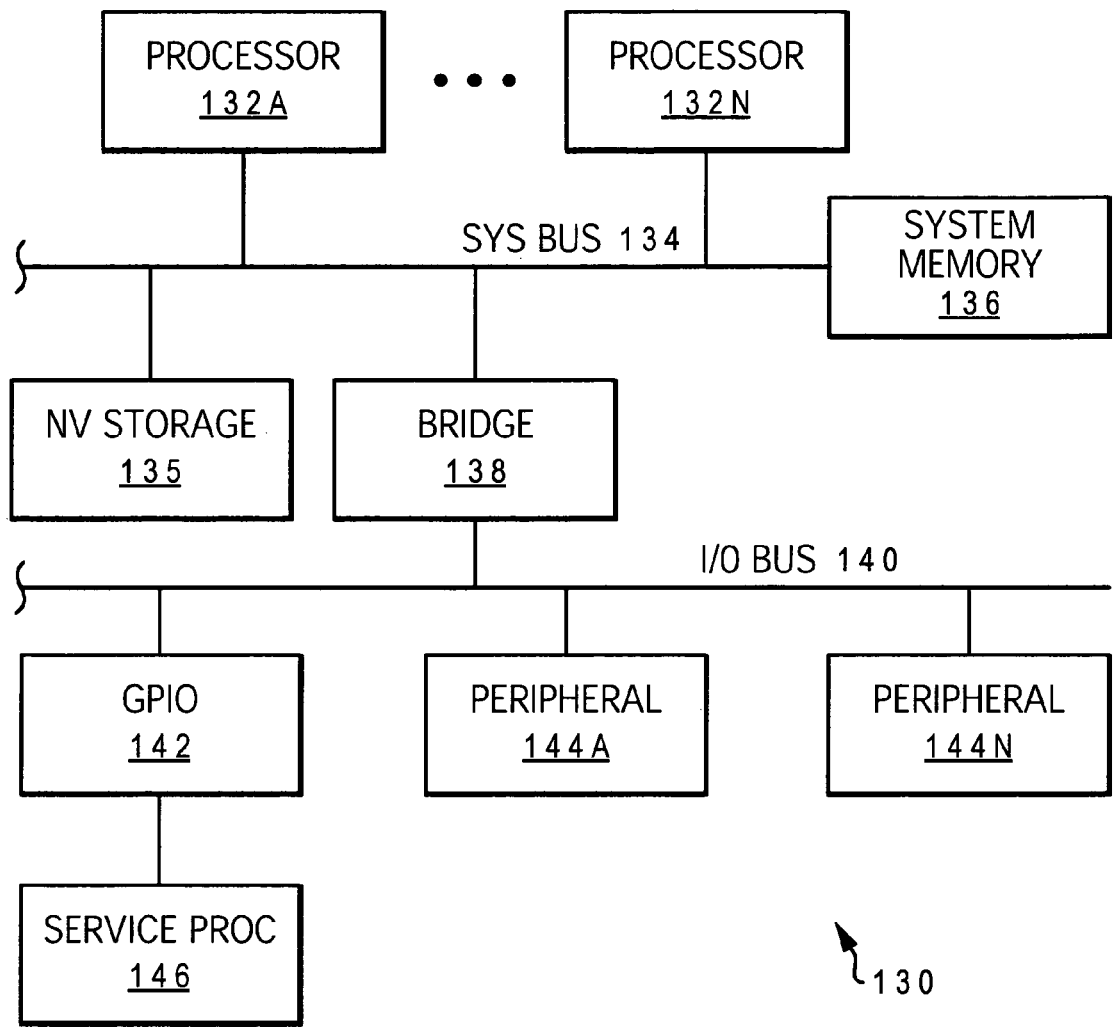
FIG. 1 is a block diagram illustrating an exemplary data processing system in which a preferred embodiment of the present invention may be implemented.

With reference to the figures and in particular with reference to FIG. 1, there is depicted a block diagram illustrating an exemplary data processing system 130 in which a preferred embodiment of the present invention may be implemented.

As depicted, data processing system 130 includes a set of main processors 132a through 132n (generically or collectively referred to as processor(s) 132) that are coupled to a system bus 134. A system memory 136 is accessible to each processor 132 via system bus 134. System memory 136 is typically implemented with a volatile storage medium such as an array of dynamic random access memory (DRAM) devices. The depicted architecture of data processing system 130 is frequently referred to as a symmetric multiprocessor (SMP) system because each processor 132 has substantially equal access to system memory 136.

As depicted, non-volatile (NV) storage 135 (e.g., a hard disk drive or read-only memory) is coupled to system bus 134. Also, a bus bridge 138 provides an interface between system bus 134 and an I/O bus 140, which further couples one or more peripheral devices 144A through 144N (generically or collectively referenced as peripheral device(s) 144) and a general purpose I/O (GPIO) port. Peripheral devices 144 may include devices such as a graphics adapter, a high-speed network adapter, or network interface card (NIC), a hard-disk controller, and other peripherals. I/O bus 140 is typically compliant with one of several industry standard I/O bus specifications including, as a common example, the Peripheral Components Interface (PCI) bus as specified in *PCI Local Bus Specification Rev.* 2.2 by the PCI Special Interest Group (www.pcisig.com).

The depicted embodiment of data processing system 130 includes a local service processor 146 coupled to GPIO port 142. Local service processor 146 is configured to provide support for main processors 132. This support may include, for example, monitoring the power supplied to main processor(s) 132 and, in the event of a data processing system crash, initiating a restart of processor(s) 132.

Figure 2A:
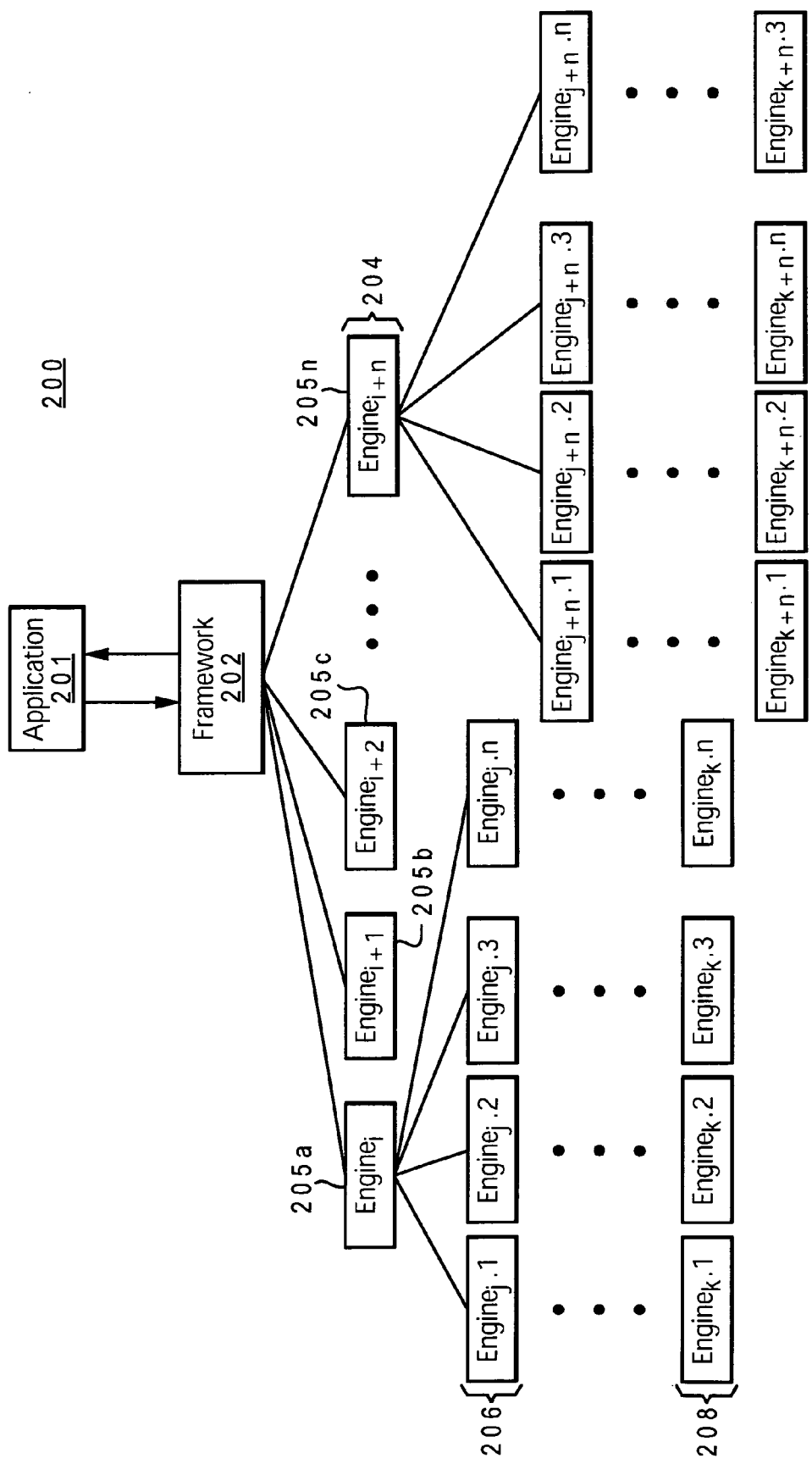
FIG. 2A depicts a conceptual representation of selected portions of a verification system according to a preferred embodiment of the present invention.

Referring now to FIG. 2A, a general, conceptual representation of selected portions of verification system 200 according to a preferred embodiment of the present invention is illustrated. As depicted, verification system 200 includes one or more applications 201, a framework 202, and at least one branch of instantiated engines 205a-205n. Each branch of instantiated engines 205a-205n includes multiple levels 204, 206, and 208.

A system user typically interfaces with application 201 to define a verification problem. Those with skill in this art will appreciate that application 201 may include logic to assist a system user with the definition of the verification problem. A verification problem typically includes a netlist or another suitable representation of a circuit structure and a set of expected values at one or more of the circuit's nets that are to be proven or disproven through verification testing. An expected value is proven if a state or sequence of states produces the expected value on the specified circuit net(s).

As depicted, application 201 interfaces with a design verification framework 202 that is configured to create instances of (instantiate) a set of verification engines in one or more sequences typically defined by the user via application program 201. After the verification engines are instantiated, framework 202 passes the verification problem to the instantiated engines. As depicted, the instantiated engines are typically arranged in a tree-like architecture having one ore more verification branches from which other branches may split off. At the apex of this tree structure is framework 202, which controls the flow of the various partitions of the verification problem among the instantiated engines.

Within each verification branch 205, the verification problem may be modified by one or more verification engines. The verification engines that may be instantiated or invoked by framework 202 include modification engines and decision engines. Modification engines are configured to modify (and presumably simplify) a given verification problem while decision engines act on a modified or an unmodified verification problem to attempt to solve that problem. Ultimately the verification branch terminates with a "leaf" engine representing the last engine in a given branch. Each such leaf engine is typically a decision engine that attempts to solve a verification problem.

Once a verification branch 205 has terminated, the leaf engine at test termination has usually identified at least one counterexample trace for the original verification problem or proved that the problem has no solution. Assuming that the leaf engine in a particular branch was successful in solving a particular problem (i.e., the leaf engine has generated at least one counterexample trace), the leaf engine then passes the discovered trace to its parent engine. The parent engine is then responsible for modifying the received trace to reflect any modifications to the netlist that the parent engine made before the parent engine passed the netlist to the leaf engine. After modifying the trace, the parent engine then passes the modified trace to its (a second) parent engine, which further modifies the trace to reflect modifications the second parent engine initiated and so forth until the trace is passed back to framework 202. In this manner, the trace passed back to framework 202 from each of the branches 205 will be consistent with the netlist generated by framework 202.

During processing of a verification problem, the verification engines may learn certain verification facts that may make it easier for other engines to solve their respective partition of the verification problem. A verification engine that learned the fact propagates any such learned information to its parent or its child. Also, a parent engine that has received a fact learned from a first child engine may pass the learned information to a second engine to assist in the processing of the second engine. Each of these modules will pass the learned information to their respective parents and children. In this manner, the learned information is propagated throughout the tree arrangement. This, as illustrated in FIG. 2A, the information passed from $Engine_i$ in level 204 to each child engine (such as $Engine_j.1$ or $Engine_k.1$) may include a partition of the verification problem as well as learned facts generated by other verification engines about the circuit design. The information passed back from the child engines may include pass/fail information, one or more counterexample traces, and learned facts.

Another feature of a preferred embodiment of the present invention includes enabling a parent engine, such as $Engine_i$ in level 204, to gather results from independent child engines, such as $Engine_j.1$ or $Engine_j.2$ in level 206, combine the results, and utilize the combined results to imply a result for the original unpartitioned problem received by $Engine_j$ in level 204.

Still another feature of a preferred embodiment of the present invention includes enabling an engine, such as $Engine_j$ in level 204, to send information to framework 202 that includes a partition number and an engine that would be best suited to process the partition indicated by the relayed partition number.

In a preferred embodiment of the present invention, each verification engine may determine that the verification problem must be divided, or partitioned further after the engine's initial processing of the verification problem. The verification engine that divides the verification problem will be hereinafter referred to as a "case-split engine". However, the exact number of partitions required for effective processing of the verification may not be known until preliminary processing of the partitioned problem is performed by a subsequent instantiated engine.

For example, consider an abstraction-refinement scheme. An engine, such as Engine$_i$ in level 204 may determine that the entire verification problem is too complex to handle at once. Therefore, Engine$_i$ in level 204 may isolate (partition) a portion of the circuit design by injecting random cut points to certain gates in the netlist through the utilization of dedicated processing to determine the optimal location of such cut points. The insertion of cut points abstracts the design by simplifying the problem to be solved by subsequent engines.

After processing the simplified problem may yield a trace indicating that the resulting abstracted design may violate a certain property, which would generate erroneous results that appear like a failure. For example, Engine$_i$ in level 204 may realize that the failure is spurious and only due to the location of the cut points. Engine$_i$ in level 204 will then realize that a refinement in the location of cut points in the netlist is needed, which results in the re-partitioning of the verification problem, and then pass the newly abstracted to another set of case-split engines.

The flexible nature of the case-split engines overcomes one of the limitations of the prior art. In the prior art, an instantiated engine must pass all parts of the verification problem according to a framework-defined engine flow. In a preferred embodiment of the present invention, each engine may determine whether the part of the verification received from a parent engine should be further partitioned and each further partition may be passed to a different engine by the case-split engine. Those with skill in this art will appreciate that the partitions may be passed serially or in parallel, depending on the nature of the verification problem to be solved. These features of the present invention will be discussed further in more detail in conjunction with FIGS. 3A and 3B.

Framework 202 and the various verification engines are preferably compliant with a common Application Program Interface (API) to facilitate the exchange of information passed from one engine to the next. According to a preferred embodiment of the present invention, each verification engine must support a specified set of functions so that verification tasks will be handled in a consistent manner by each of the engines. The API, for example, may specify a function to create the logical AND of two nets in a netlist.

Figure 2B:
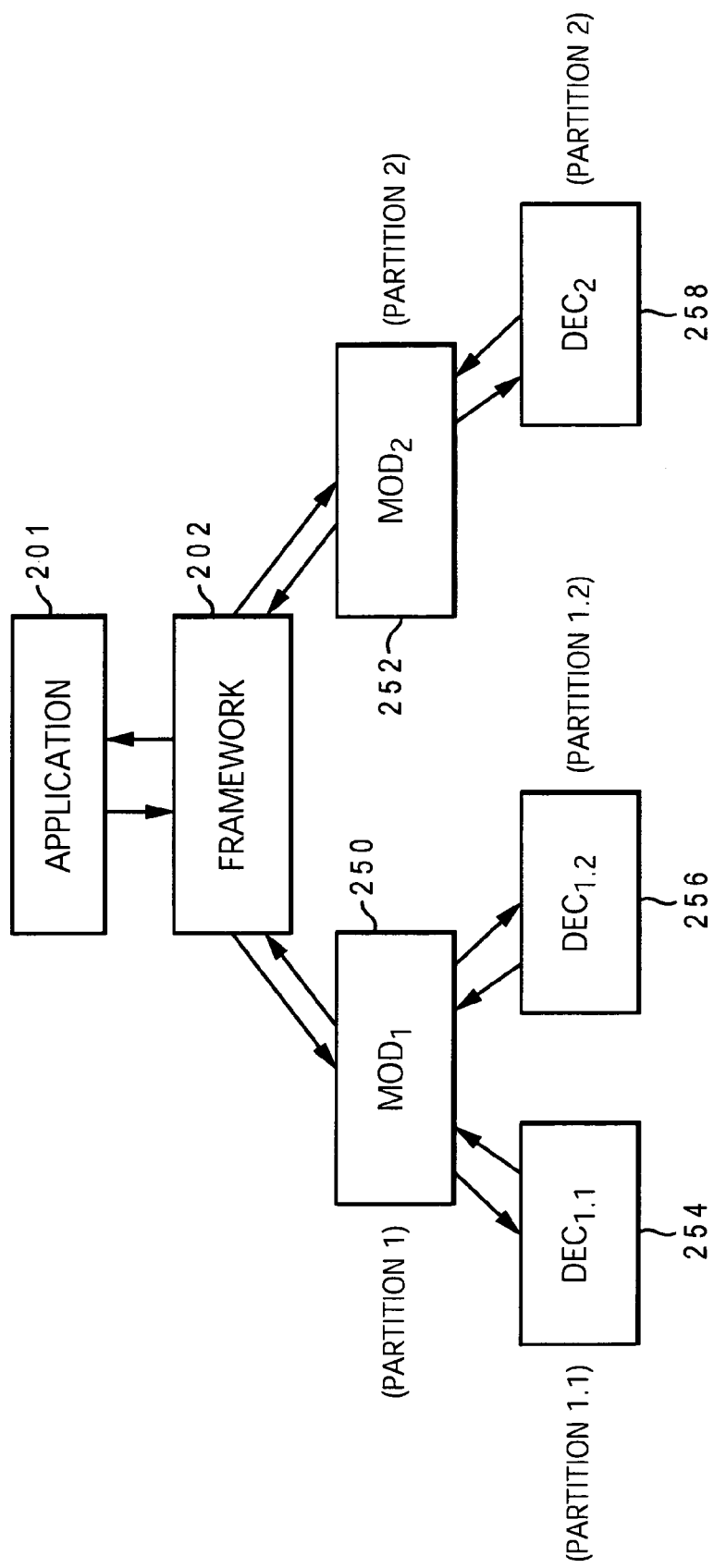
FIG. 2B illustrates a second conceptual representation of a verification system according to a preferred embodiment of the present invention.

FIG. 2B depicts a second conceptual representation of verification system 200 according to a preferred embodiment of the present invention. As previously discussed in conjunction with FIG. 2A, application 201 interfaces with framework 202 to define and pass a verification problem to verification engines 250, 252, 254, 256, and 258. As depicted, framework 202 has decided to divide the verification problem into two partitions (partitions 1 and 2), instantiated two modification engines 250 and 252 to process the partitions, and passed the verification problem to modification engines 250 and 252. As previously discussed, the present invention does not require that modification engines 250 and 252 be of the same type.

As depicted, modification engine 250 has determined that partition 1 of the verification problem would be more effectively processed if the partition was further divided into partition 1.1 and partition 1.2. As illustrated, partition 1.1 is processed by modification engine 254 and partition 1.2 is processed by decision engine 256. Also, modification engine 252 has determined that partition 2 does not have to be further divided. Therefore, modification engine 252 and decision engine 258 processes partition 2. This feature of the present invention addresses one of the limitations of the prior art, which did not allow verification engine case-splitting and processing by distinctly different verification engines. Each instantiated verification engine can determine whether or not its received partition of the verification problem should be further partitioned and processed by distinctly different verification engines. For example, as illustrated in FIG. 2B, modification engine 250 determined that the processing of partition 1 would be more effective if partition 1 was further divided into partition 1.1 and partition 1.2. Also, as depicted, partition 1.1 and partition 1.2 are handed off and processed with distinctly different verification engines (modification engine 254 and decision engine 256).

Figure 3A:
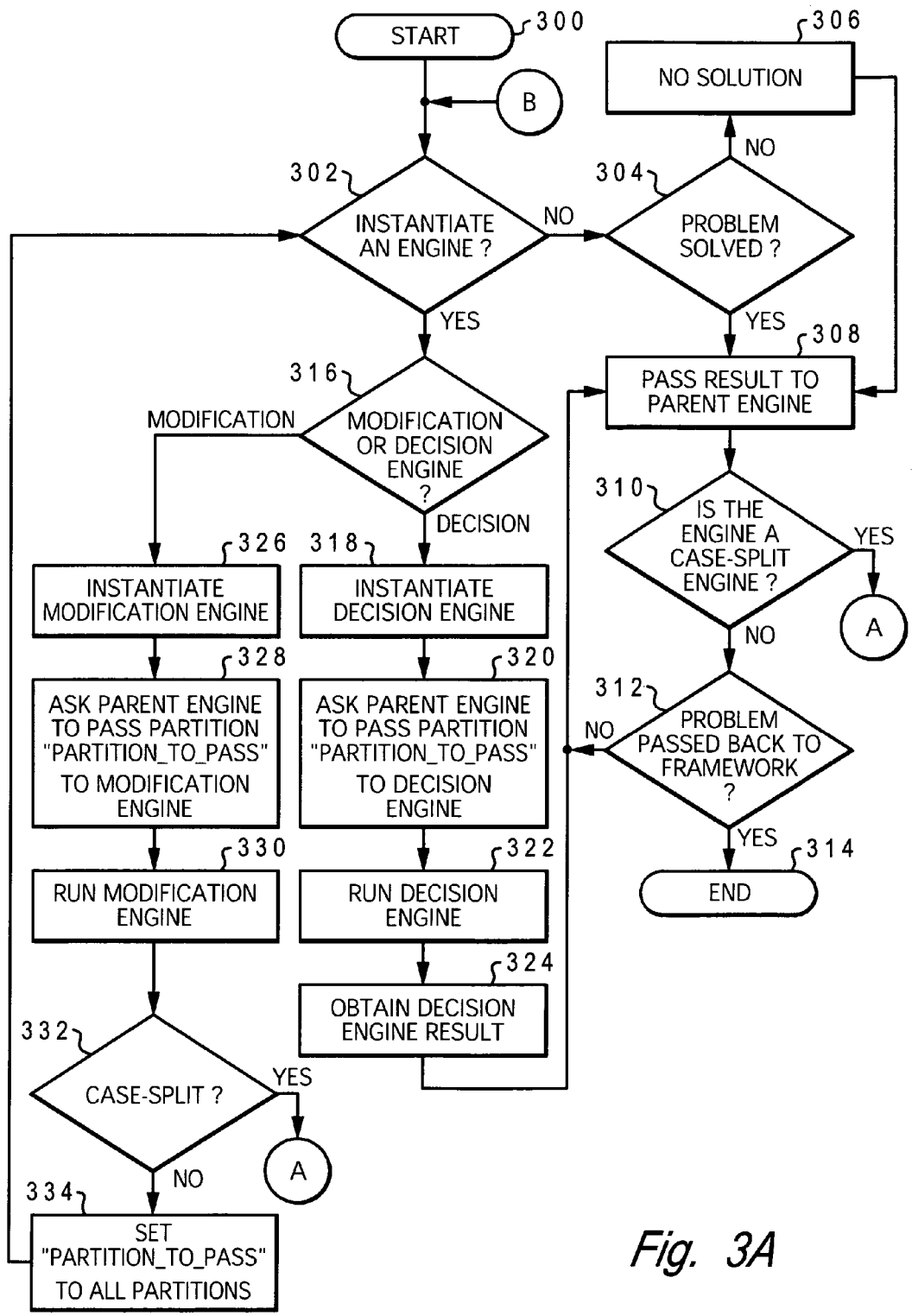
FIG. 3A depicts a first high-level logical flowchart depicting a process of engine-controlled case splitting according to a preferred embodiment of the present invention.

With reference to FIG. 3A, there is a high-level logical flowchart depicting a process of engine-controlled case splitting according to a preferred embodiment of the present invention. The process depicted in FIG. 3A occurs each time framework 202 instantiates another engine to simplify or attempt to solve a verification problem.

The process begins at step 300 and then proceeds to step 302, which depicts framework 202 determining whether to instantiate an engine and pass the verification problem to the newly instantiated engine. If framework 202 determines not to instantiate an engine, the process continues to step 304, which illustrates framework 202 determining whether the verification problem has been solved. If framework 202 determines that the verification problem has not been solved, the process continues to step 306, which depicts framework 202 determining that the problem has no solution. The process then continues to step 308, which is discussed herein in more detail.

Returning to step 304, if framework 202 determines that the verification problem has been solved, the process proceeds to step 308, which illustrates the most recent engine passing the result of the calculation to its parent engine. The process then continues to step 310, which depicts framework 202 determining whether the engine is a case-split engine. If framework 202 determines that the engine is a case-split engine, the process continues to marker A, discussed later in more detail in conjunction with FIG. 3B. However, if framework 202 determines the engine is not a case-split engine, the process continues to step 312, which illustrates framework 202 determining whether the verification problem has been completely passed back to the framework. If the verification problem has not been completely passed back to framework 202, the process returns to step 308 and continues in an iterative fashion. However, if the verification problem has been completely passed back to framework 202, the process proceeds to step 314, which depicts the process ending.

Returning to step 302, if framework 202 decides to instantiate an engine, the process continues to step 316, which depicts framework 202 determining whether to instantiate a modification or decision engine. If framework 202 decides to instantiate a decision engine, the process continues to step 318, which illustrates framework 202 instantiating a decision engine. The process then continues to step 320, which depicts framework 202 instructing the parent engine of the instantiated decision engine to pass the verification problem partition to the newly-instantiated decision engine. The process then continues to step 322, which illustrates the newly-instantiated decision engine running the verification problem partition passed from the parent engine.

Then, the process proceeds to step 324, which illustrates the instantiated decision engine obtaining a result from the processing of the verification problem. Then, the instantiated decision engine passes the result to a parent engine, as depicted in step 308. The process then continues in an iterative fashion.

Returning to step 316, if framework 202 decides to instantiate a modification engine, the process continues to step 326, which depicts framework 202 instantiating a modification engine. The process then proceeds to step 328, which illustrates the parent engine of the newly-instantiated modification engine passing a partition of the verification problem. The process continues to step 330, which depicts the newly-instantiated modification engine processing the passed partition of the verification problem. Then, the process proceeds to step 332, which illustrates the newly-instantiated modification engine determining (after some processing of the partition) whether the engine should further partition the verification problem partition (whether the case should be split). If the newly-instantiated modification engine determines that the verification problem partition should be further split, the process continues to marker A. However, if the newly-instantiated modification engine determines that the verification problem partition should not be split into further partitions, the process continues to step 334, which illustrates framework 202 marking the current verification problem partition as a partition that should be passed to a next engine without further partitioning by the newly-instantiated modification engine. The process then returns to step 302 and proceeds in an iterative fashion.

Figure 3B:
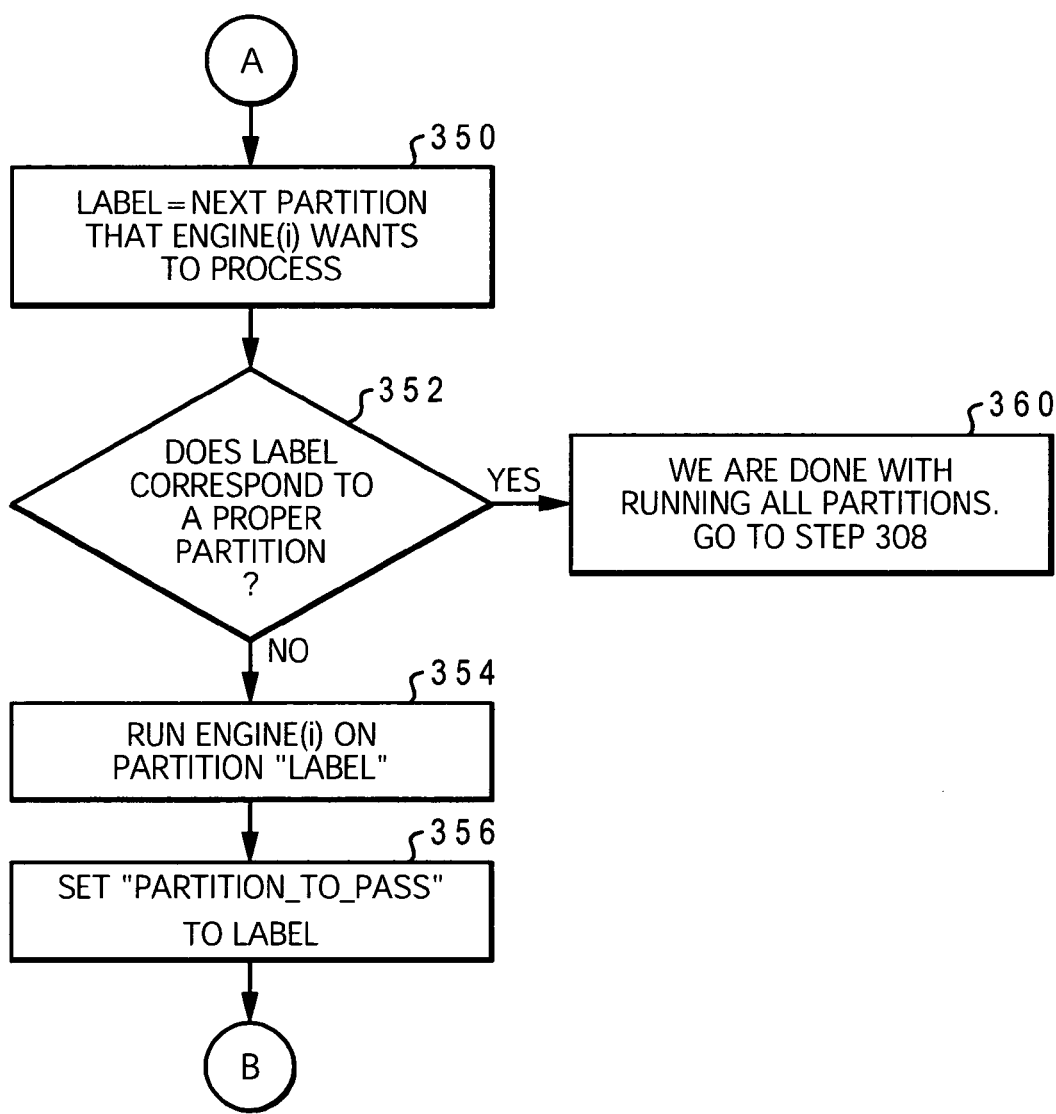
FIG. 3B illustrates a second high-level flowchart diagram depicting a process of engine-controlled case splitting according to a preferred embodiment of the present invention.

With reference now to FIG. 3B, there is a high-level flowchart diagram depicting a method of engine-controlled case splitting according to a preferred embodiment of the present invention. FIG. 3B depicts marker A, which acts as a transition from steps 310 and 332. When an engine determines that the verification problem should be further partitioned and passed on to case-split engines, framework 202 and the current engine follows the steps as illustrated in FIG. 3B.

The process begins at step 350, which illustrates the current engine setting a variable "label" equal to the next partition number the current engine wants to process. For example, as depicted in FIG. 2B, if the current engine determines that the next partition to be processed should be partition 1.2, the variable "label" will be set equal to "1.2". The process then proceeds to step 352, which depicts framework 202 determining whether "label" corresponds to a proper partition. If framework 202 determines that "label" does not correspond to a proper partition, the process continues to step 360, which depicts a determination made that all partitions of the verification problem have been processed and the process returns to step 308.

However, if "label" corresponds to a proper partition, the process continues to step 354, which illustrates the current engine processing the partition "label". The process then proceeds to step 356, which depicts framework 202 instructing the current engine to mark partition "label" as a partition that should be passed by the current engine. The process then continues to marker B, which illustrates the process returning to step 302 as depicted in FIG. 3A, where framework 202 determines whether to instantiate another engine to continue processing of the verification problem. The process then proceeds in an iterative fashion.

As disclosed, the present invention is a system and method of managing design verification of integrated circuits, such as microprocessors, utilizing modular design verification engines and a verification framework. A first set of verification engines divides a verification problem into a set of partitions and passes at least one of the set of partitions to a second set of verification engines. The second set of verification engines are verification engines of distinctly different types, such as modification and decision engines. The system framework is configured to communicate with an application program and further configured to instantiate at least one verification engine in a user-defined sequence.

While this invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal-bearing media utilized to actually carry out the distribution. Examples of signal-bearing media include, without limitations, recordable-type media such as floppy disks or CD-ROMs and transmission-type media such as analog or digital communication links.

What is claimed is:

1. A verification system, comprising:
   a plurality of verification engines;
   a system framework, coupled to said plurality of verification engines, for dividing a verification problem into a plurality of partitions for processing by distinctly separate verification engines; and
   logic within said plurality of verification engines for further dividing said plurality of partitions into a plurality of sub-partitions for processing by distinctly separate verification engines.

2. The verification system in claim 1, further comprising:
   logic within said plurality of verification engines for gathering results of said processing by distinctly separate verification engines; and
   logic within said plurality of verification engines for communicating said results to other verification engines of said plurality of verification engines to assist in processing of said other verification engines.

3. The verification system in claim 2, further comprising:
   logic within said plurality of verification engines for estimating a result for said verification problem received by said plurality of verification engines, in response to said gathering of results of said processing by distinctly separate verification engines.

4. The verification system in claim 1, further comprising:
   logic within said plurality of verification engines for notifying said system framework of said dividing of said verification problem into said plurality of sub-partitions for processing by distinctly separate verification engines.

5. The verification system in claim 1, wherein said system framework further includes:
   logic for instructing at least one of said plurality of verification engines to pass said plurality of sub-partitions for processing by distinctly separate verification engines.

6. The verification system in claim 1, wherein said system framework further includes:
   logic for instructing at least one of said plurality of verification engines to pass said plurality of sub-partitions for parallel processing by distinctly separate verification engines.

7. The verification system in claim 1, wherein said system framework further includes:

logic for instructing at least one of said plurality of verification engines to pass said plurality of sub-partitions for serial processing by distinctly separate verification engines.

8. A method of verifying an integrated circuit design, wherein a verification system includes a plurality of verification engines and a system framework, said method comprising:
dividing a verification problem into a plurality of partitions for processing by distinctly separate verification engines;
assigning said plurality of partitions to said plurality of verification engines; and
further dividing at least one of said plurality of partitions by said at least one of said plurality of verification engines into a plurality of sub-partitions for processing by distinctly separate verification engines.

9. The method of claim 8, further comprising:
gathering results of said processing by distinctly separate verification engines; and
communicating said results to other verification engines of said plurality of verification engines to assist in processing of said other verification engines.

10. The method of claim 9, further comprising:
estimating a result for said verification problem received by said plurality of verification engines, in response to said gathering of results of said processing by distinctly separate verification engines.

11. The method of claim 8, further comprising:
notifying said system framework by at least one of said verification engines of said dividing of said verification problem into said plurality of sub-partitions for processing by distinctly separate verification engines.

12. The method of claim 8, further comprising:
instructing at least one of said plurality of verification engines to pass said plurality of sub-partitions for parallel processing by distinctly separate verification engines.

13. The method of claim 8, further comprising:
instructing at least one of said plurality of verification engines to pass said plurality of sub-partitions for serial processing by distinctly separate verification engines.

14. A computer program product for verifying an integrated circuit design utilizing a verification system that includes a plurality of verification engines, a system framework, comprising:
instructions, stored on a computer-readable medium, for dividing a verification problem into a plurality of partitions for processing by distinctly separate verification engines;
instructions, stored on a computer-readable medium, for assigning said plurality of partitions to said plurality of verification engines; and
instructions, stored on a computer-readable medium, for further dividing at least one of said plurality of partitions by said at least one of said plurality of verification engines into a plurality of sub-partitions for processing by distinctly separate verification engines.

15. The computer program product according to claim 14, further comprising:
instructions, stored on a computer-readable medium, for gathering results of said processing by distinctly separate verification engines; and
instructions, stored on a computer-readable medium, for communicating said results to other verification engines of said plurality of verification engines to assist in processing of said other verification engines.

16. The computer program product according to claim 15, further comprising:
instructions, stored on a computer-readable medium, for estimating a result for said verification problem received by said plurality of verification engines, in response to said gathering of results of said processing by distinctly separate verification engines.

17. The computer program product according to claim 14, further comprising:
instructions, stored on a computer-readable medium, for notifying said system framework of said dividing of said verification problem into said plurality of sub-partitions for processing by distinctly separate verification engines.

18. The computer program product according to claim 14, further comprising:
instructions, stored in computer-readable media, for instructing at least one of said plurality of verification engines to pass said plurality of sub-partitions for parallel processing by distinctly separate verification engines.

19. The computer program product according to claim 14, further comprising:
instructions, stored in computer-readable media, for instructing at least one of said plurality of verification engines to pass said plurality of sub-partitions for serial processing by distinctly separate verification engines.

* * * * *